US010268949B2

(12) United States Patent
Eleftheriou et al.

(10) Patent No.: US 10,268,949 B2
(45) Date of Patent: Apr. 23, 2019

(54) ARTIFICIAL NEURON APPARATUS

(71) Applicant: International Business Machines Corporation, Armonk, NY (US)

(72) Inventors: Evangelos S. Eleftheriou, Rueschlikon (CH); Lukas Kull, Zurich (CH); Angeliki Pantazi, Thalwil (CH); Abu Sebastian, Adliswil (CH); Milos Stanisavljevic, Adliswil (CH); Tomas Tuma, Adliswil (CH)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 603 days.

(21) Appl. No.: 15/075,314

(22) Filed: Mar. 21, 2016

(65) Prior Publication Data
US 2017/0270404 A1 Sep. 21, 2017

(51) Int. Cl.
*G06N 3/063* (2006.01)
*G06N 3/04* (2006.01)

(52) U.S. Cl.
CPC .......... *G06N 3/0635* (2013.01); *G06N 3/049* (2013.01)

(58) Field of Classification Search
CPC .............................. G06N 3/0635; G06N 3/049
USPC .......... 706/23; 365/46, 55, 74, 97, 100, 131, 365/148, 158, 171, 173, 163
See application file for complete search history.

(56) References Cited

U.S. PATENT DOCUMENTS 9,460,387 B2 10/2016 Oleg et al.
2007/0022070 A1 1/2007 Wells et al.
2010/0238713 A1* 9/2010 Norman ................. G11C 7/062
365/148
2012/0084241 A1 4/2012 Friedman et al.
2015/0006455 A1 1/2015 Suri et al.

FOREIGN PATENT DOCUMENTS

WO 2012006465 A1 1/2012

OTHER PUBLICATIONS

C. David Wright, et al.,"Novel Applications Possibilities for Phase-Change Materials and Devices", EPCOS, 2013, p. 1-6.
M. D. Pickett, et al.,"A scalable neuristor built with Mott memristors", Nature Materials, Letters, Dec. 16, 2016, p. 1-4.
S. R. Ovshinsky, "The Ovonic Cognitive Computer—A New Paradigm", Research Gate, 2004, p. 1-8.

* cited by examiner

*Primary Examiner* — Fernando Hidalgo
(74) *Attorney, Agent, or Firm* — Cantor Colburn LLP; Daniel Morris

(57) ABSTRACT

Artificial neuron apparatus includes a resistive memory cell connected in an input circuit having a neuron input, for receiving neuron input signals, and a current source for supplying a read current to the cell. The input circuit is selectively configurable in response to a set of control signals, defining alternating read and write phases of operation, to apply the read current to the cell during the read phase and to apply a programming current to the cell, for programming cell resistance, on receipt of a neuron input signal during the write phase. The cell resistance is progressively changed from a first state to a second state in response to successive neuron input signals. The apparatus further includes an output circuit comprising a neuron output and a digital latch which is connected to the input circuit for receiving a measurement signal dependent on cell resistance.

13 Claims, 4 Drawing Sheets

ARTIFICIAL NEURON APPARATUS

BACKGROUND

The present invention relates generally to artificial neuron apparatus, and more particularly to artificial neurons based on resistive memory cells.

Neuromorphic technology relates to computing systems which are inspired by biological architectures of the nervous system. Conventional computing systems are based on binary logic and sequential von Neumann architectures. While efficient in performing tasks such as numerical calculations, separation between external memory and processors in these systems leads to energy-hungry data movements. Compared to the human brain, the conventional computing paradigm is highly inefficient in terms of power consumption and space requirements. These issues have prompted a significant research effort to understand the highly efficient computational paradigm of the human brain and to create artificial cognitive systems with unprecedented computing power. For example, there is a strategic intent to develop "neuromorphic co-processors" able to carry out event-based computations in compute-intensive tasks such as "big data" analytics and real-world sensory applications.

Neurons, along with synapses, are basic computational units in the brain. A neuron can integrate the input signals it receives. In biological neurons, a thin lipid-bilayer membrane is used to separate the electrical charge inside of the cell from that outside of it. The membrane potential, which represents the stored neuron state, is progressively modified by the arrival of neuron input signals. When the membrane potential traverses a specific voltage threshold, the neuron will "fire", generating an output signal known as an "action potential" or "spike", and then revert to its initial state. These spikes are conveyed to other neurons via synapses which change their connection strength ("plasticity" or "synaptic weight") as a result of neuronal activity.

The realization of efficient artificial neurons is of fundamental importance to neuromorphic technology. Most prior proposals for artificial neurons are based on hybrid analog/digital VLSI circuits, requiring complex CMOS circuitry with a large number of transistors to emulate neuronal functionality. Resistive memory cells such as phase-change memory (PCM) cells have also been recognized as suitable candidates for the realization of neural hardware (see e.g. "The Ovonic Cognitive Computer—A New Paradigm", Ovshinsky, Proc. E/PCOS, 2004, and "Novel Applications Possibilities for Phase-Change Materials and Devices", Wright et al., Proc. E/PCOS, 2013). Resistive memory cells are programmable-resistance devices which rely on the variable resistance characteristics of a volume of resistive material disposed between a pair of electrodes. These cells are memristors, i.e., devices that remember the history of the current that has flowed through them. A neuron circuit based on Mott memristors has also been proposed in "A Scalable Neuristor built with Mott Memristors", Pickett et al. Nature Materials, 2013.

Prior artificial neurons based on memristive devices have been concerned only with emulating the integrate-and-fire functionality or emulating the biological action potential shape. Concrete realizations for efficient artificial neurons for operation in a neural network configuration remain a challenge.

SUMMARY

According to at least one embodiment of the present invention there is provided artificial neuron apparatus. The apparatus includes a resistive memory cell connected in an input circuit having a neuron input, for receiving neuron input signals, and a current source for supplying a read current to the cell. The input circuit is selectively configurable in response to a set of control signals, defining alternating read and write phases of operation, to apply the read current to the cell during the read phase and to apply a programming current to the cell, for programming cell resistance, on receipt of a neuron input signal during the write phase. The cell resistance is progressively changed from a first state to a second state in response to successive neuron input signals. The apparatus further includes an output circuit comprising a neuron output and a digital latch which is connected to the input circuit for receiving a measurement signal dependent on cell resistance. The latch is operable in response to the read phase to latch a digital value dependent on the measurement signal. A first value is latched if cell resistance has not reached the second state, and a second value is latched if cell resistance has reached the second state. The output circuit is adapted to provide a neuron output signal at the neuron output during the write phase if the second value is latched.

Apparatus embodying the invention offers efficient neuron realizations suitable for connectivity and operation in a neural network configuration. The neuron circuitry permits compact implementation, allowing high-density integration in neuromorphic networks. Configuration of the neuron circuitry for the read and write phases of operation is controlled by one or more control signals. Such a control signal can be a simple periodic signal which can be easily generated, for example from a system clock, and can be readily applied to multiple neuron circuits for efficient, global control of a multi-neuron network.

In preferred embodiments of the neuron apparatus, the input circuit is further configurable in response to the neuron output signal to apply a reset current to the cell for resetting the cell resistance to the first state. In these embodiments, the neuron output signal, or "spike" is conveniently used to effect reset of the cell during the write phase, so that the neuron reverts to its initial state ready for a new cycle of operation.

The output circuit preferably includes a logic gate connected between the latch and the neuron output, the logic gate being operable in response to the write phase to provide the neuron output signal when the second value is latched. With this arrangement, the neuron spike is conveniently synced to the write phase, facilitating interconnection of neurons in a synchronous arrangement with the spike from one neuron providing a neuron input signal which is synced to the write phase for the next neuron.

The input circuit may include at least one access device, connected between a first terminal of the cell and a reference terminal of the circuit, for enabling current flow through the cell in response to said read phase and said neuron input signal. In preferred embodiments, the input circuit includes respective access devices, connected between the first terminal of the cell and the reference terminal, for enabling current flow through the cell in response to said read phase, said neuron input signal and said neuron output signal. Use of such access devices in the neuron input circuit allows simple control of cell operation during the read and write phases. In preferred implementations here, the current source is connected to a second terminal of the cell and the input circuit includes a switch connected to the second terminal, the switch being operable to apply the programming current to the cell during the write phase. This provides a simple input circuit configuration, and simple output circuits for use with such arrangements will be described further below.

At least one further embodiment of the invention provides a neuromorphic system comprising a plurality of interconnected neurons, each comprising neuron apparatus according to an embodiment above, and a control signal generator for generating the set of control signals which is supplied to at least a plurality of neurons in the system.

Embodiments of the invention will be described in more detail below, by way of illustrative and non-limiting example, with reference to the accompanying drawings.

DETAILED DESCRIPTION

The embodiments to be described provide artificial neuron apparatus based on resistive memory cells. In examples below, the resistive memory cell is a PCM cell. The variable-resistance properties of PCM cells arise from heating a volume of chalcogenide material between the cell electrodes so as to change the relative proportions of a (high-resistance) amorphous phase and a (low-resistance) crystalline phase in the chalcogenide volume. If a voltage less than a certain threshold switching voltage is applied to the cell via the electrodes, the current will be so small that there will be very little Joules of heat applied and substantially no resulting phase change in the cell volume. However, if a programming (or "write") signal above the threshold voltage is applied, cell resistance drops to a very low value during application of the pulse through the phenomenon of electronic threshold switching. This enables the flow of a large current which results in significant Joules of heat being applied and a subsequent phase change. For a cell initially in the high-resistance state, application of a programming pulse with a certain input power and duration, based on cell characteristics and circuit design, causes partial crystallization of the amorphous region, with a consequent reduction in cell resistance after programming. The cells exhibit an accumulation property whereby, through application of many such programming pulses, resistance of the memory cell can be progressively reduced down to a very low value compared to the initial high-resistance state. The cell-resistance can be measured (or "read") at any time by applying a low-voltage signal to the electrodes and measuring the resulting current flow through the cell. The signal level for the read operation is low enough that the read operation does not disturb the programmed cell-state.

Figure 1:
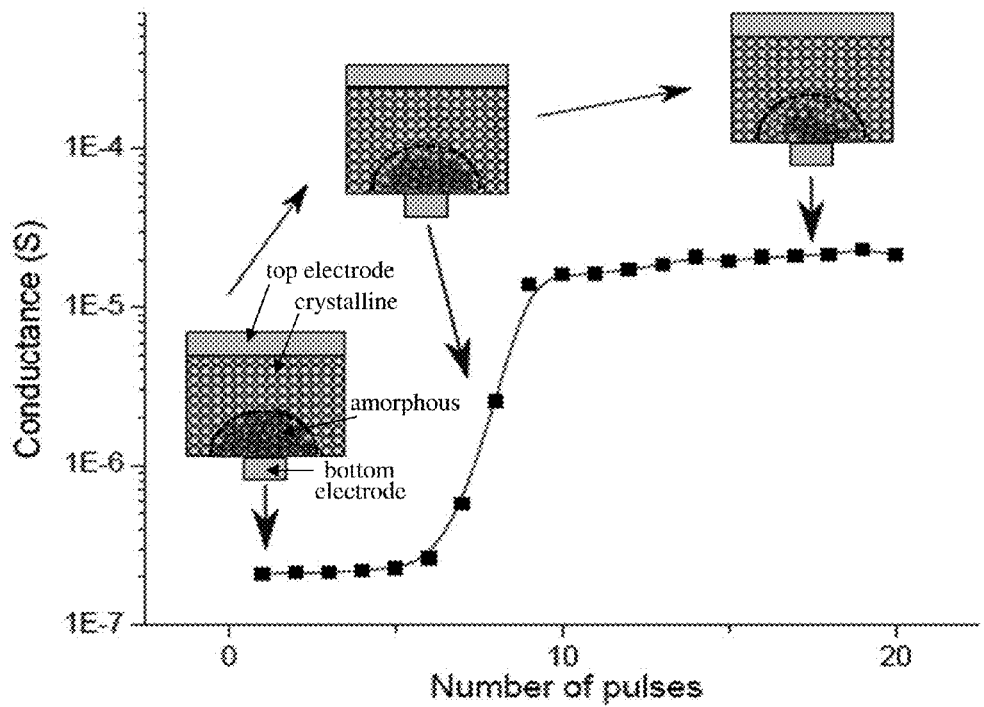
FIG. 1 is a schematic illustration of progressive crystallization in a phase-change memory cell.

The above process is illustrated schematically in FIG. 1. This figure shows the evolution of cell state, in terms of electrical conductance (inverse of resistance) of the PCM cell, as a function of the number of programming pulses. The cell shown in FIG. 1 is of the "mushroom cell" type, having a chalcogenide material such as GST (Germanium-Antimony-Tellurium) disposed between a first, "top" electrode and a second, "bottom" electrode. The smaller, bottom electrode serves as a heater for heating a dome of amorphous chalcogenide within the otherwise crystalline material. Resistance is initially high (low conductance) due to presence of the high-resistance amorphous dome between the electrodes. Successive programming pulses cause partial crystallization of the amorphous volume, whereby cell-resistance is progressively reduced. After a certain number of pulses, the conductance gradient rises sharply causing switching of the cell to the low-resistance (high-conductance) state. The cell can be reset to its initial high-resistance state by application of a pulse of sufficient power to melt the chalcogenide material adjacent the bottom electrode. The high-resistance amorphous dome is then restored on cooling.

Figure 2:
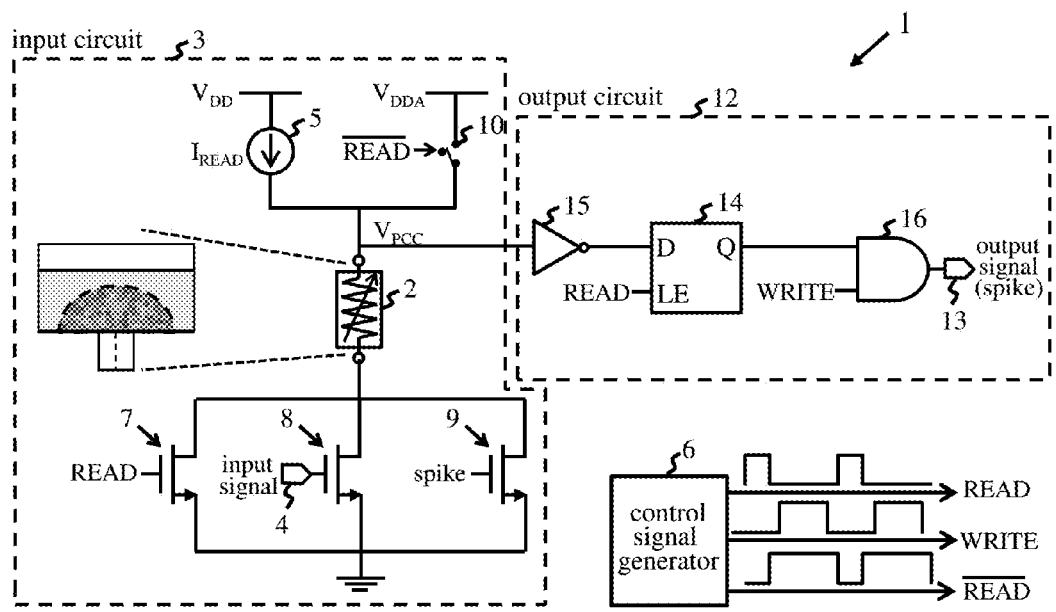
FIG. 2 shows artificial neuron apparatus according to one or more embodiments of the invention.

FIG. 2 is a schematic block diagram showing structure of a first neuron apparatus 1 according to one or more embodiments of the invention. The neuron apparatus 1 includes a PCM cell which is represented by variable resistance 2 and may be of the mushroom-cell type as indicated in the enlargement. The PCM cell 2 is connected in an input circuit 3. The input circuit 3 has a neuron input 4 for receiving neuron input signals in operation. The neuron input signals may be generated by one or more other circuits in a neuromorphic system in which neuron 1 is connected. For example, output signals from other neurons may be supplied, e.g. via synapse circuits, as input signals to neuron 1. Signals representing external neuron stimuli, e.g. from circuits emulating sensory receptors, may also be supplied as neuron input signals.

The input circuit 3 includes a current source 5 for supplying a constant read current $I_{READ}$ to PCM cell 2 in operation. The input circuit 3 is selectively configurable in response to a set of control signals which define alternating read and write (programming) phases of operation. These control signals are produced by a control signal generator, indicated at 6, which can be provided externally of neuron 1 and may provide control signals to multiple neurons in a neuromorphic system. In general, the set of control signals may comprise one or more control signals, and input circuit 3 may be selectively configurable in response to one or more of these signals. In this embodiment, the control signals include a read signal (READ) which comprises a periodic train of rectangular pulses as indicated schematically in FIG. 2. The read phase of neuron operation occurs when the read signal is high. The write phase of neuron operation occurs during the period when the read signal is low. In particular, the control signals in one or more embodiments include a write signal (WRITE) comprising a periodic, rectangular-pulse train, and the write phase corresponds to the period for which this write signal is high. This occurs during the period when READ is low, whereby the READ and WRITE signals define alternating read and write phases in operation. The control signal set for this embodiment also includes a signal $\overline{READ}$ which is the inverse of the read signal READ.

Input circuit 3 further includes a set of access devices for enabling current flow through PCM cell 2 in operation. One or more embodiments employ three access devices, implemented here by FETs (field-effect transistors) 7, 8 and 9, which are connected between a first (here the lower) terminal of cell 2 and a reference terminal of the circuit, here a signal earth (i.e., ground). The gate of first FET 7 receives the read signal READ and enables current flow through cell 2 in response to the read phase. The gate of second FET 8 is connected to the neuron input 4 and enables current flow through cell 2 in response to neuron input signals. The gate of third FET 9 receives a neuron output signal, or "spike", produced at an output of neuron 1 as explained below, enabling current flow through cell 2 in response to this signal. The current source 5 is connected between a second (here the upper) terminal of cell 2 and a first voltage supply line $V_{DD}$. The input circuit also includes a switch 10 which is connected between the upper cell terminal and a second voltage supply line $V_{DDA}$. Switch 10 is operable in response to the control signal $\overline{READ}$ to apply a programming current to the cell during the write phase of operation if access device 8 or 9 is enabled. In particular, switch 10 closes when the control signal $\overline{READ}$ is high, connecting cell 2 to supply line $V_{DDA}$ during this period and hence during the write phase when WRITE is high. The voltage $V_{DDA}$ is typically higher than voltage $V_{DD}$ to provide a high programming current that is sufficiently high for programming of cell 2.

The neuron 1 additionally includes an output circuit indicated 12. Output circuit 12 comprises a neuron output 13 and digital latch 14. The latch 14 is connected to the input circuit 3, in this embodiment via an inverter 15, for receiving a measurement signal dependent on cell resistance in operation. In particular, the measurement signal is supplied to a data input D of the latch. The read control signal READ is supplied to an enable input LE of the latch. The latch operates to latch a digital value dependent on the measurement signal when its enable input LE goes high, i.e. in response to the read phase of operation defined by READ=high. The resulting latched value is provided at a latch output Q. When the latch enable input LE goes low, i.e. READ=low, the latch output Q remains as it was when LE was last high.

The output circuit 12 of this embodiment also includes a logic gate, here an AND gate 16, connected between the latch 14 and neuron output 13. One input of AND gate 16 is connected to the latch output Q, and the other input receives the write control signal WRITE. The AND gate 16 thus provides a neuron output signal (spike) at output 13 during the write phase (WRITE=high) if latch output Q is also high. Neuron spikes are thus conveniently synced to the write phase. Where neuron input signals result from spikes from other, like neurons in a network configuration, the input signals can be conveniently synced to the write phase in this way.

The various circuit components of neuron 1 can be implemented in generally known manner, and the neuron apparatus can be fabricated as an integrated nanoelectronic circuit using well-known material processing techniques. For example, current source 5 may be implemented by a transistor, switch 10 may be realized by a transistor or diode, and components 14 to 16 may be implemented using standard transistor logic. The periodicity of control signals can be set as desired based on cell characteristics and desired operating speeds. By way of example, a typical signal period for the above circuit may be 200 to 500 ns.

In operation, during the read phase when READ=high, FET 7 is switched on and switch 10 is open. In this configuration, the read current $I_{READ}$ from current source 5 is applied to PCM cell 2. This read current is too small to change the PCM cell state as explained earlier. The resulting voltage at the upper cell terminal, denoted by $V_{PCC}$ in FIG. 2, depends on resistance of the PCM cell. During the write phase when WRITE=high, switch 10 is closed because $\overline{READ}$ is also high. If a neuron input signal is received at input 4 during this phase, FET 8 will switch on and a programming current, for programming cell resistance, will be applied to PCM cell 2. (A sufficiently large current for cell-programming can be achieved here by appropriate selection of (one or a combination of) the supply voltage $V_{DDA}$, the characteristics of access device 8, and the neuron input signal characteristics as will be apparent to those skilled in the art). In this way, cell resistance can be progressively changed, as explained with reference to FIG. 1, from a first (here high-resistance) state to a second (here low-resistance) state in response to successive neuron input signals received during write phases of neuron operation. The voltage $V_{PCC}$ at the upper cell terminal during the read phase, which provides the measurement signal, will change from a high to a low value as cell resistance changes. This signal is inverted by inverter 15, the output of which thus changes from low to high. In particular, when cell-resistance switches to the low-resistance state, voltage $V_{PCC}$ will traverse a predetermined threshold $V_{TH}$, and the inverted measurement signal at the inverter output will switch from low to high. Prior to this point (i.e. when cell resistance has not reached the second, low-resistance state), $V_{PCC} > V_{TH}$ in the read phase, the D input of latch 14 is low, and a first value, here logic 0, is latched by latch 14 during the read phase (READ=high at latch input LE). The latch output Q thus remains at logic 0. Subsequently, in the first read phase when cell resistance has reached the second, low-resistance state, $V_{PCC} < V_{TH}$, the D input of latch 14 goes high, and a second value, here logic 1, is latched by latch 14 during that read phase. The latch output Q thus switches to logic 1. Latch output Q remains high for the next write phase when WRITE goes high. The AND gate 16 then generates a spike at neuron output 13 during this write phase.

It will be seen from the above that neuron output circuit 12 produces a spike at output 13 during the write phase if logic 1 is latched by latch 14, i.e. if cell resistance has reached the low-resistance state as indicated by the measurement signal in the immediately preceding read phase. In this embodiment, the input circuit 3 is configurable in response to this spike to apply a reset current to PCM cell 2 for resetting the cell resistance to the high-resistance state. In particular, a spike produced at neuron output 13 during a write phase is applied to the gate of FET 9, enabling flow of a reset current through PCM cell 2 during this write phase. A sufficiently large reset current can be achieved here by appropriate selection of one or a combination of the characteristics of access device 9, the supply voltage $V_{DDA}$, and the neuron output signal characteristics (e.g. amplitude and/or duration) as will be apparent to those skilled in the art. The PCM cell 2 is thus reset to its initial, pre-accumulation state during the write phase in which neuron 1 fires.

As described earlier, spikes produced on firing of neuron 1 may be relayed to one or more other neurons in a network arrangement, providing input signals to these neurons. Spikes may be relayed via synapse circuits which may modify spike characteristics (e.g. amplitude and/or duration) according to synaptic weight. Synapse circuits may be implemented in various ways and synapse implementation is orthogonal to operation of the neurons described herein. It suffices to appreciate that neuron input signals may vary in form, and their effect on programming of cell resistance may vary accordingly.

Figure 3:
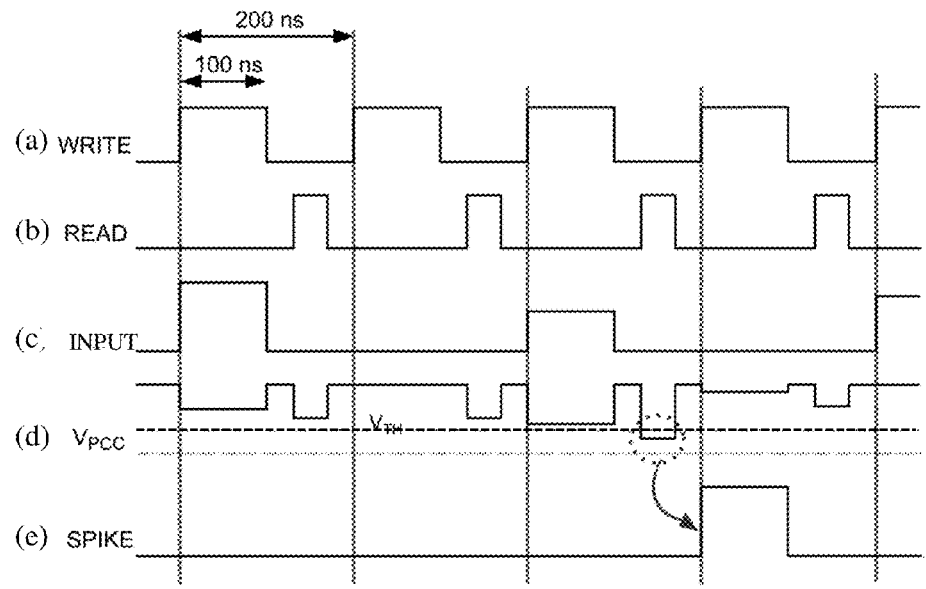
FIG. 3 is a schematic timing diagram indicating operation of the FIG. 2 apparatus.

The neuron operation described above is conveniently illustrated in the signal timing diagram of FIG. 3. The top section (a) of this diagram shows an exemplary WRITE signal as a pulse train of period 200 ns defining a 100 ns write phase. Section (b) shows an exemplary READ signal. Section (c) shows neuron input signals applied to input 4 during the first and third write phases in the figure. Section (d) indicates the voltage $V_{PCC}$ during the phases approaching and traversing the firing threshold. In the first write phase (WRITE=high), a neuron input signal is received and cell resistance is reduced via the programming operation. In the next read phase (READ=high), cell resistance is still above the firing threshold ($V_{PCC}>V_{TH}$). No input signal is received during the second write phase and cell resistance remains unchanged. In the third write phase, a further input signal is received and cell resistance is further reduced. In the next read phase, the measured cell resistance has traversed the firing threshold ($V_{PCC}<V_{TH}$) as highlighted by the circle in the figure. A spike is then produced at neuron output 13 during the fourth write phase as indicated in section (e). This spike effects reset of the cell as described above, whereby the measured cell resistance is restored to its initial, high-resistance state in the following read phase.

It will be seen that the above embodiment provides an efficient, fully-functional neuron implementation for connectivity and operation in a neural network configuration. The apparatus employs a hybrid of analog components (PCM cell, access devices, current source and switch) and digital components (latch, inverter, AND logic gate), all of which elements are typically of very small size. The circuitry thus offers highly compact neuron implementation, allowing seamless high-density integration in multi-neuron networks, for example via highly-dense synaptic arrays. The control signals for controlling circuit configuration are simple periodic signals. These can be applied globally in a multi-neuron system for synchronization of neuron operations, and can be readily generated from a system clock.

Figure 4:
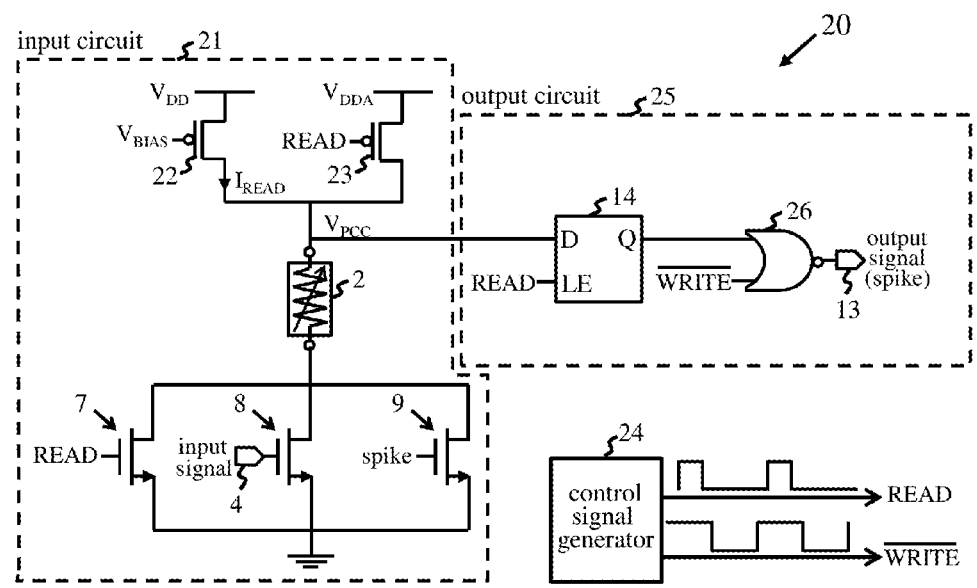
FIG. 4 shows artificial neuron apparatus according to one or more embodiments of the invention.

A second neuron apparatus embodying the invention will be described with reference to FIGS. 4 and 5. The neuron structure is shown in FIG. 4 and corresponds broadly to that of FIG. 2. Like elements are indicated by like reference numerals, and only key differences will be described below. The neuron 20 of this embodiment has an input circuit 21 in which the read current source is implemented by a PMOS (P-type metal-oxide-semiconductor) transistor 22 whose gate is held at a bias voltage $V_{BIAS}$. The switch between PCM cell 2 and supply voltage $V_{DDA}$ is also implemented by a PMOS transistor 23. This transistor 23 receives the read control signal READ at its gate. Due to PMOS operation, the transistor 23 is switched on when READ is low. Operation of switch 23 is thus equivalent to that of switch 10 in FIG. 2, but the inverted control signal $\overline{READ}$ is not required. In this embodiment, control signal generator 24 generates two control signals READ and $\overline{WRITE}$, where $\overline{WRITE}$ is the inverse of the WRITE signal in FIG. 2. The read phase is again defined by READ=high, whereas the write phase is defined by $\overline{WRITE}$=low.

The output circuit 25 of neuron 20 includes a latch 14 as before, but no inverter is required. The D input of latch 14 is thus connected directly to the upper terminal of PCM cell 2, and the latch output Q is inverted compared to the operation in FIG. 2. The AND gate of FIG. 2 is replaced by a NOR gate 26 in output circuit 25. The second input of NOR gate 26 receives the control signal $\overline{WRITE}$, whereby gate 26 generates a spike on neuron output 13 in response to the write phase ($\overline{WRITE}$=low) when logic 0 is latched by latch 14. This occurs when cell resistance has dropped to the low-resistance state ($V_{PCC}<V_{TH}$) in the preceding read phase.

Figure 5:
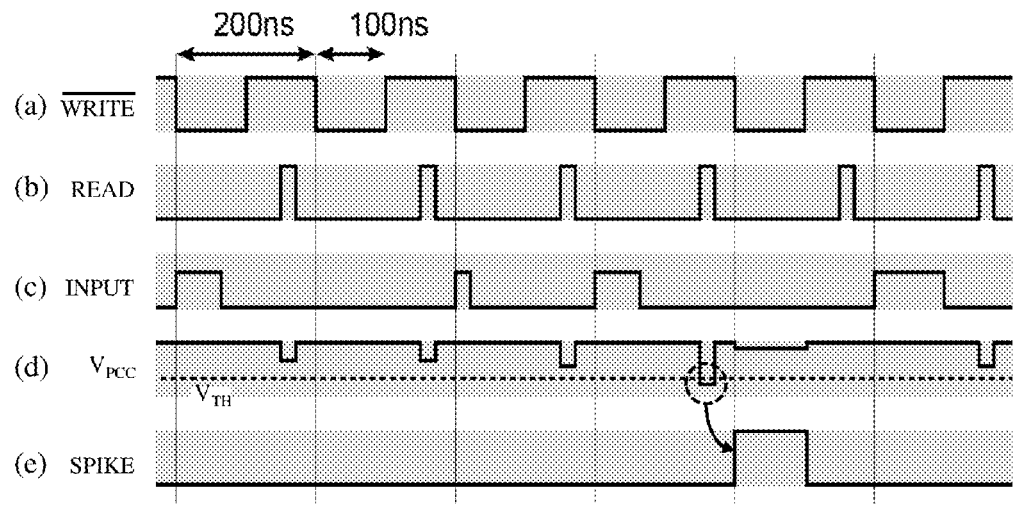
FIG. 5 is a schematic timing diagram indicating operation of the FIG. 4 apparatus.

The operation of neuron 20 is indicated in the timing diagram of FIG. 5 for a series of neuron input signals of varying duration. The input signal received in the fourth write phase here results in switching of the cell to the low resistance state. In the following read phase, the measured cell resistance has traversed the firing threshold ($V_{PCC}<V_{TH}$). A spike is then produced at neuron output 13 during the next write phase. This spike effects reset of the cell as described above, whereby the measured cell resistance is restored to its initial high-resistance state in the following read phase.

Figure 6:
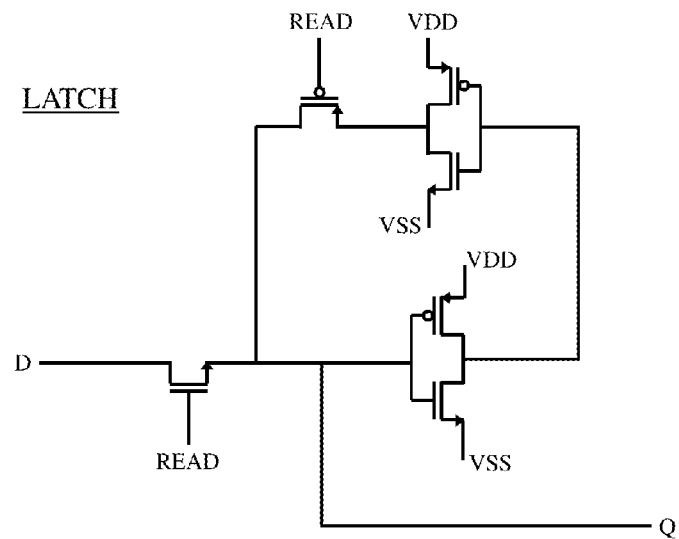
FIG. 6 shows one implementation of a digital latch for use in neuron apparatus according to one or more embodiments of the invention.
Figure 7:
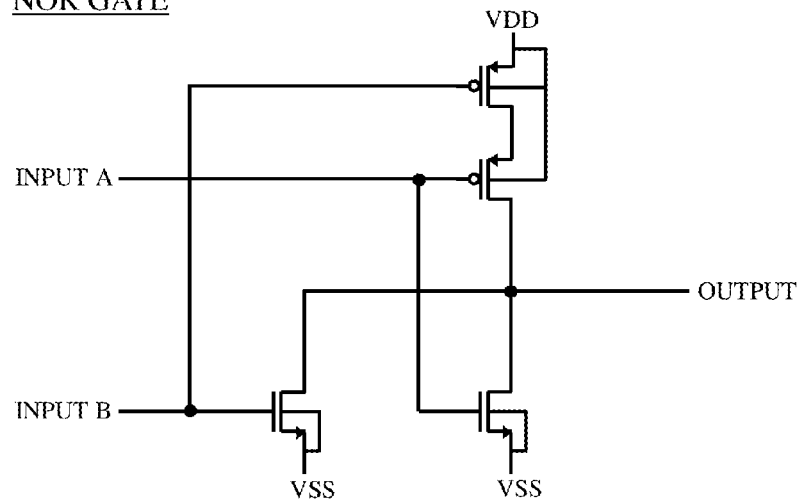
FIG. 7 shows one implementation of a NOR gate for use in the neuron apparatus of FIG. 4.

The neuron 20 thus operates generally as neuron 1, but the number of control signals is reduced due to elimination of the $\overline{READ}$ signal, and the circuit design is even more compact. By way of example, an implementation of neuron 20 with only fifteen transistors can be achieved using a minimalistic latch design illustrated in FIG. 6 and a NOR gate construction shown in FIG. 7. An implementation of neuron 20 in the 14-nm technology node occupies an area of less than 1 μm$^2$, and power consumption of the logic is less than 10% that of PCM cell 2.

Figure 8:
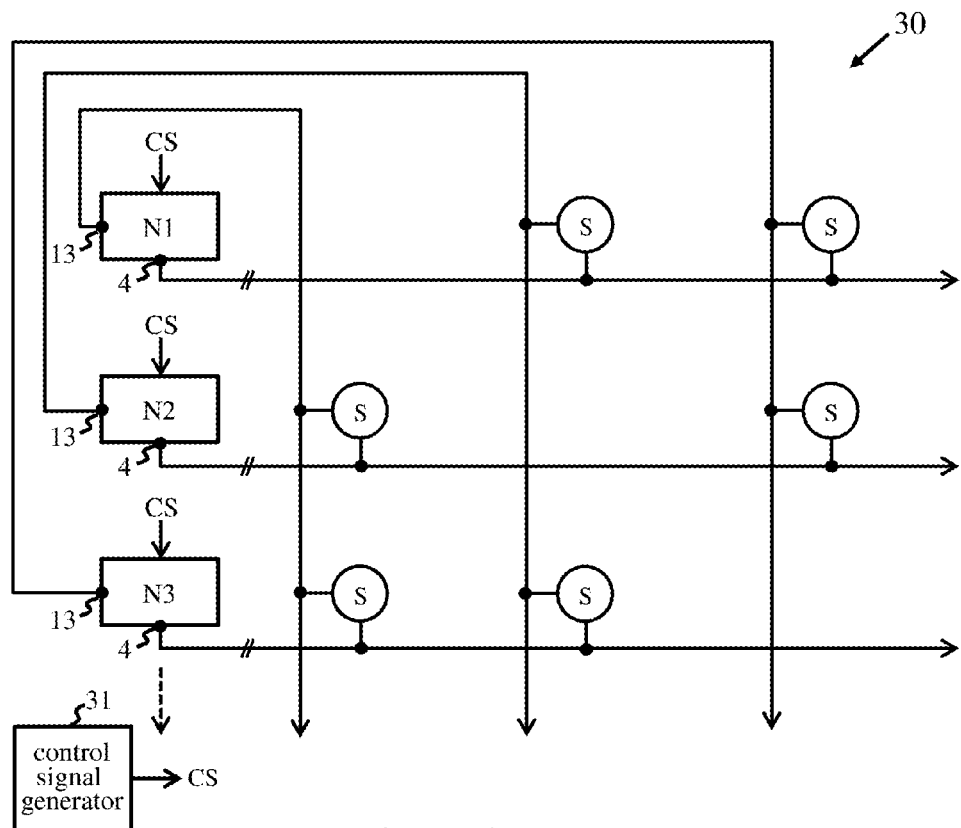
FIG. 8 is a schematic illustration of a neuromorphic system based on neurons configured according to one or more embodiments of the invention.

FIG. 8 is a simple schematic indicating how neurons 1, 20 may be connected in a neuromorphic system embodying the invention. The system 30 comprises a plurality of interconnected neurons, three of which are indicated as N1, N2 and N3. A control signal generator 31 generates a set of global control signals CS for controlling configuration of the neuron circuitry. This control signal set is supplied to at least a plurality of neurons N1, N2, N3, etc., in system 30, and may be supplied to all neurons in the system. The neurons are interconnected via an array of synapses S, arranged in rows and columns in the figure. The output 13 of each neuron provides an input to all synapses S in a respective column of the array. The input 4 of each neuron receives the outputs from all synapses in a respective row of the array. In this way, each synapse S is connected between a respective pair of neurons for relaying output signals from one neuron (the "pre-neuron") to the input of the other neuron (the "post-neuron"). As described earlier, synapses may modify these signals according to synaptic weight, and system 30 may include additional neuron/synapse connections (not shown) to allow adjustment of synaptic weights, e.g. based on relative timing of pre- and post-neuron spikes. However, the details of synaptic operation are orthogonal to the neuron functionality described herein.

Numerous changes and modifications may of course be made to the exemplary embodiments described above. For example, control signals need not be rectangular pulse trains. Control pulses may, for instance, have shaped leading and/or trailing edges if desirable for cell operation. Also, separate read and write control signals are used to define the read and write phases in the embodiments above. This allows read and write phases to be temporally separated, with a time interval between them. Separating the phases in this way may be advantageous depending on cell operating characteristics, particularly for high-speed operation. However, alternating read and write phases could be defined by different levels of a single control signal in other embodiments. As a further example, while the above embodiments use access device 9 to provide an efficient cell reset mechanism, other reset mechanisms can be envisaged, e.g. via a global reset signal which is selectively applied to the cell in response to a spike event. Circuit configuration may be controlled in various other ways via different control signals, and other logic arrangements, e.g. using different logic gates and/or latch input/output arrangements, are also possible. Output circuits in which the latch is connected directly to the neuron output may also be envisaged. Input circuits in some embodiments may also use a single access device which is responsive to more than one signal for enabling current flow, e.g. one FET functioning as more than one of FETS 7 to 9 above. Input circuits may also be designed to operate with a single voltage supply line if desired.

Neurons embodying the invention may of course use PCM cells other than the mushroom-cell type, as well as other resistive memory cells. Some examples include resistive RAM (RRAM) cells such as conductive bridge RRAM cells, oxide or metal-oxide RRAM cells, and carbon RRAM cells. In addition, the circuit examples above have been described for operation in which the neuron fires, generating the output signal, in a low-resistance state of the memory cell, and the cell is then reset to a high-resistance state. During the accumulation phase, the cell-resistance is thus progressively reduced by successive neuron input signals. Other embodiments may be based on operation in which the neuron fires when the cell is in a high-resistance state, the cell is reset to a low-resistance state, and cell-resistance is progressively increased by successive neuron input signals in the accumulation phase. Any resistive memory cell, which may include bipolar devices, in which resistance can be progressively increased may be used in such embodiments, one example being CBRAM (conductive bridge RAM) cells. Suitable circuit modifications to accommodate such cell operation will be readily apparent to those skilled in the art.

In general, where a component is described herein as connected to another component, such components may be connected directly or indirectly, e.g. via intervening components, unless otherwise indicated.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. Artificial neuron apparatus comprising:
a resistive memory cell connected in an input circuit;
wherein the input circuit includes a neuron input configured to receive neuron input signals, and a current source for supplying a read current to the cell;
wherein the input circuit is further configured to be selectively configurable in response to a set of control signals that define alternating read and write phases of operation, and is further configured to apply the read current to the cell during said read phase and to apply a programming current to the cell, for programming cell resistance, on receipt of a said neuron input signal during said write phase, wherein cell resistance is progressively changed from a first state to a second state in response to successive neuron input signals; and
an output circuit comprising a neuron output and a digital latch which is connected to the input circuit and configured to receive a measurement signal dependent on cell resistance, the latch being configured to be operable in response to said read phase to latch a digital value dependent on the measurement signal such that a first value is latched if cell resistance has not reached said second state and a second value is latched if cell resistance has reached said second state, wherein the output circuit is configured to provide a neuron output signal at said neuron output during said write phase if said second value is latched.

2. Apparatus as claimed in claim 1 wherein the input circuit is further configured to, in response to said neuron output signal, apply a reset current to the cell for resetting the cell resistance to said first state.

3. Apparatus as claimed in claim 1 wherein the output circuit includes a logic gate connected between the latch and said neuron output, the logic gate being configured to be operable in response to said write phase to provide said neuron output signal when said second value is latched.

4. Apparatus as claimed in claim 1 wherein the input circuit includes at least one access device connected between a first terminal of the cell and a reference terminal of the circuit, wherein said at least one access device is configured to enable current flow through the cell in response to said read phase and said neuron input signal.

5. Apparatus as claimed in claim 2 wherein the input circuit includes respective access devices connected between a first terminal of the cell and a reference terminal, wherein said respective access devices are configured to enable current flow through the cell in response to said read phase, said neuron input signal and said neuron output signal.

6. Apparatus as claimed in claim 4 wherein said current source is connected to a second terminal of the cell and the input circuit includes a switch connected to said second terminal, wherein the switch is configured to be operable to apply said programming current to the cell during said write phase.

7. Apparatus as claimed in claim 6 wherein the latch is connected to the second terminal of the cell and configured to receive said measurement signal, and wherein the output circuit includes a NOR gate connected between the latch and said neuron output and configured to be operable in response to said write phase to provide said neuron output signal when said second value is latched.

8. Apparatus as claimed in claim 6 wherein the latch is connected to the second terminal of the cell via an inverter configured to supply said measurement signal, and wherein the output circuit includes an AND gate connected between the latch and said neuron output and configured to be operable in response to said write phase to provide said neuron output signal when said second value is latched.

9. Apparatus as claimed in claim 1 wherein the resistive memory cell comprises a phase-change memory cell, and wherein the cell resistance is progressively reduced between said first and second states in response to successive neuron input signals.

10. Apparatus as claimed in claim 1 wherein said set of control signals comprises a read signal and a write signal that defines said alternating read and write phases respectively.

11. Apparatus as claimed in claim 5 wherein:
the resistive memory cell comprises a phase-change memory cell and the cell resistance is progressively reduced between said first and second states in response to successive neuron input signals;
said current source is connected to a second terminal of the cell and the input circuit includes a switch connected to said second terminal, the switch being configured to be operable to apply said programming current to the cell during said write phase;

the latch is connected to the second terminal of the cell and configured to receive said measurement signal; and the output circuit includes a NOR gate connected between the latch and said neuron output and configured to be operable in response to said write phase to provide said neuron output signal when said second value is latched.

12. A neuromorphic system comprising a plurality of interconnected neurons, each comprising apparatus as claimed in claim 1, and a control signal generator configured to generate said set of control signals, wherein the set of control signals is supplied to at least a plurality of neurons in the system.

13. A neuromorphic system comprising a plurality of interconnected neurons, each comprising apparatus as claimed in claim 11, and a control signal generator configured to generate said set of control signals, wherein the set of control signals is supplied to at least a plurality of neurons in the system.

\* \* \* \* \*